(12) United States Patent
Mine et al.

(10) Patent No.: US 9,214,516 B2
(45) Date of Patent: Dec. 15, 2015

(54) FIELD EFFECT SILICON CARBIDE TRANSISTOR

(75) Inventors: Toshiyuki Mine, Tokyo (JP); Yasuhiro Shimamoto, Tokyo (JP); Hirotaka Hamamura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 62 days.

(21) Appl. No.: 14/240,376

(22) PCT Filed: Mar. 30, 2012

(86) PCT No.: PCT/JP2012/002224
§ 371 (c)(1),
(2), (4) Date: Feb. 22, 2014

(87) PCT Pub. No.: WO2013/145023
PCT Pub. Date: Oct. 3, 2013

(65) Prior Publication Data
US 2014/0217422 A1    Aug. 7, 2014

(51) Int. Cl.
*H01L 29/16* (2006.01)
*H01L 21/04* (2006.01)
*H01L 29/66* (2006.01)
*H01L 29/78* (2006.01)
*H01L 29/792* (2006.01)

(52) U.S. Cl.
CPC .......... *H01L 29/1608* (2013.01); *H01L 21/046* (2013.01); *H01L 21/049* (2013.01); *H01L 29/66068* (2013.01); *H01L 29/7802* (2013.01); *H01L 29/792* (2013.01)

(58) Field of Classification Search
CPC .................................................. H01L 29/1608
See application file for complete search history.

(56) References Cited

U.S. PATENT DOCUMENTS

| 2010/0295060 A1 | 11/2010 | Kudou et al. |
| 2012/0019284 A1 | 1/2012 | Mauder et al. |
| 2012/0214309 A1 | 8/2012 | Itoh et al. |
| 2013/0175549 A1 | 7/2013 | Okumura |

FOREIGN PATENT DOCUMENTS

| EP | 1 689 000 A1 | 8/2006 |
| JP | 2002-222950 A | 8/2002 |
| JP | 2008-270258 A | 11/2008 |
| JP | 2009-141144 A | 6/2009 |
| JP | 2011-091186 A | 5/2011 |
| JP | 2011-254119 A | 12/2011 |
| WO | WO 2011/158528 A1 | 12/2011 |
| WO | WO 2012/036165 A | 3/2012 |

OTHER PUBLICATIONS

Office Action issued Feb. 10, 2015, in Japanese Patent Application No. 2014-507015.
Extended European Search Report issued Oct. 8, 2015, in European Patent Application No. 12873344.1.

*Primary Examiner* — Evan Pert
(74) *Attorney, Agent, or Firm* — Miles & Stockbridge P.C.

(57) ABSTRACT

In a SiC-MOSFET power device for which a SiC substrate is used, a laminated insulating film having a charge-trapping characteristic is employed as a gate insulating film of the SiC-DiMOSFET, and charges are injected into the laminated insulating film, thereby suppressing a change in the gate threshold voltage.

12 Claims, 6 Drawing Sheets

FIELD EFFECT SILICON CARBIDE TRANSISTOR

TECHNICAL FIELD

The present invention relates to a semiconductor device for which a silicon carbide (SiC) substrate is used, and particularly to a silicon carbide semiconductor device satisfying both high channel mobility and high threshold voltage.

BACKGROUND ART

In order to be used as a power device, a SiC MOSFET does not only need to be highly resistant against pressure, but is also desirably a normally-off type transistor in many applications. Even when the SiC MOSFET is a normally-off type transistor, if the threshold voltage $V_{th}$ is set to near 0 [V], erroneous turn-on occurs due to a change in the gate potential Vg. Therefore, it is necessary to increase the threshold voltage Vth to a certain extent.

In addition, a power device, particularly, a (lateral) DMOSFET having a channel in an in-plane direction needs to realize a low on-resistance (the improvement of the channel mobility of MOSFET).

As a technique to increase the channel mobility of MOSFET, there are a technique to decrease the large interface state density at the SiC/Si oxide film interface so as to reform the SiC/Si oxide film interface (PTL 1) and a technique to implant a channel into SiC from the SiC/Si oxide film interface having a large interface state density (PTL 2).

Specifically, PTL 1 described in [0004] and [0005] that, when a nitriding treatment is carried out on a SiC/Si oxide film (thermal oxidation, LP-CVD) interface right below a gate oxide film in a SiC-n channel MOSFET (nMOSFET), the interface state density decreases so that it is possible to increase the channel mobility.

PTL 2 describes that a Double-Implanted MOSFET (Di-MOSFET) in which a short-circuited channel (implanted channel) obtained by counter-doping nitrogen into a channel is used can improve the channel mobility. Furthermore, PTL 2 describes that, in a case in which the threshold voltage is preferentially increased, the dose amount of nitrogen being counter-doped decreases.

CITATION LIST

Patent Literature

PTL 1: JP-A-2011-91186
PTL 2: JP-A-2011-254119
PTL 3: JP-A-2008-270258

SUMMARY OF INVENTION

Technical Problem

However, it is not possible to limitlessly determine the driving range of the gate voltage Vg. An excessively high gate voltage Vg generates a strong electric field in a gate insulating film and thus the reliability of the gate insulating film decreases. When determining the threshold voltage, it is necessary not only to use a normally-off type transistor, but also to set the threshold voltage to a voltage approximately several volts higher than 0 [V] to prevent erroneous turn-on as described above.

However, when it is attempted to realize a high channel mobility using the techniques of PTL 1 and 2, the threshold voltage decreases, and thus it is difficult to satisfy both high channel mobility and high threshold voltage.

An object of the invention is to satisfy both high channel mobility and high threshold voltage.

Solution to Problem

The present inventors and the like paid attention to the gate voltage (Vg)-drain current (Id) characteristic lines of the above-described related art.

In a case in which a reforming treatment is carried out on a SiC/Si oxide film interface, the slope of the characteristic curve does not significantly change depending on the degree of nitriding, and, instead, the gate voltage (Vg)-drain current (Id) characteristic line substantially shifts in parallel toward the low voltage side due to nitriding. In a case in which the threshold voltage is increased, since the characteristic curve shifts toward the high voltage side, the drain current (Id) obtained at the driving upper limit value of the gate voltage (Vg) (for example, gate voltage Vg=18 [V]) decreases. In addition, the technique of PTL 1 is originally a technique to obtain a large drain current (Id) by decreasing the threshold voltage, and is not means for improving the threshold voltage.

In PTL 2, in a case in which the threshold voltage Vth is preferentially increased, the dose amount of nitrogen being counter-doped decreases as described above.

Figure 10:
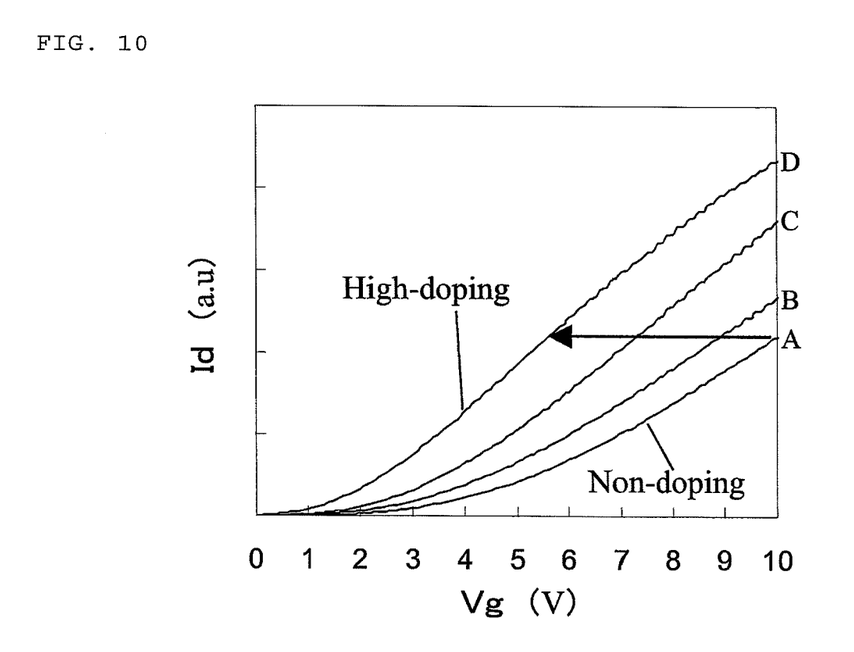
FIG. 10 is a comparison view of the gate voltage (Vg)-drain current (Id) characteristics of specimens having different concentrations of counter-injected nitrogen.

The inventors and the like paid attention to the point that, in the gate voltage (Vg)-drain current (Id) characteristic line of PTL 2, the slope of the characteristic curve significantly changed depending on the dose amount being counter-doped. FIG. 10 illustrates the comparison of the gate voltage (Vg)-drain current (Id) characteristics of specimens having different concentrations of counter-injected nitrogen. Line A represents the specimen to which nitrogen is not injected (Non-doping), and Lines A, B, C and D (High-doping) represent the specimens to which nitrogen is injected so as to have an increasing concentration sequentially. It is found that, when the concentration of nitrogen (N) is increased, the Vg-Id characteristic shifts leftward, and the threshold voltage (Vth) decreases. However, the characteristic does not simply shift in parallel, and, as the dose amount of nitrogen being counter-injected is increased or Vth is decreased, the channel mobility significantly increases, and the drain current (Id) forms an abruptly rising characteristic curve. While the concentration of counter nitrogen is set to be slightly higher than the concentration of aluminum in a p-type body in the above-described example, when the concentration of counter nitrogen is further increased, the channel mobility also increases.

When it is attempted to increase the threshold voltage Vth by decreasing the dose amount of nitrogen being counter-injected as described in PTL 2, the rise of the characteristic curve becomes smooth, and the mobility becomes too low, and therefore it is not possible to obtain a sufficient drain current.

As described above, the present inventors found that another means for adjusting the threshold voltage Vth while suppressing a decrease in the mobility is required instead of a method for decreasing the dose amount of nitrogen being counter-injected when increasing the threshold voltage.

As a technique to increase the threshold voltage Vth, there is a method of increasing the concentration of impurities in a p-base region. However, in the above-described method, the mobility significantly decreases, and it is not possible to decrease the on-resistance. In addition, in a case in which a termination having a different concentration from the concentration of impurities in the p-base region is required, a process for injecting p impurities using a separate mask becomes necessary.

Therefore, the inventors and the like wondered that it is possible to shift the threshold voltage Vth while retaining the high mobility of a SiC-MOSFET when a gate insulating film is formed using a laminated film (Si oxide film/Si nitride film/Si oxide film (ONO film) or the like) having an electron-trapping characteristic, carriers are injected into the electron-trapping layer, and the injected carriers are held in the gate driving voltage range.

PTL 3 discloses the injection and retention (storage) of carriers in an ONO film, which is a gate insulating film in a Si trench, as a method for shifting the threshold voltage of a Si trench-type MOSFET. However, PTL 3 is simply means for adjusting Vth in Si. In the Si field, the combination of counter injection and the above-described technique is not easily conceived even by a person having ordinary skill in the art. This is because, in the case of Si, the mobility is high, and the (Vg-Id) characteristic curve, simply, substantially shifts in parallel depending on a change in the concentration of impurities by counter injection, and therefore the combination with PTL 3 is not meaningful.

Figure 11:
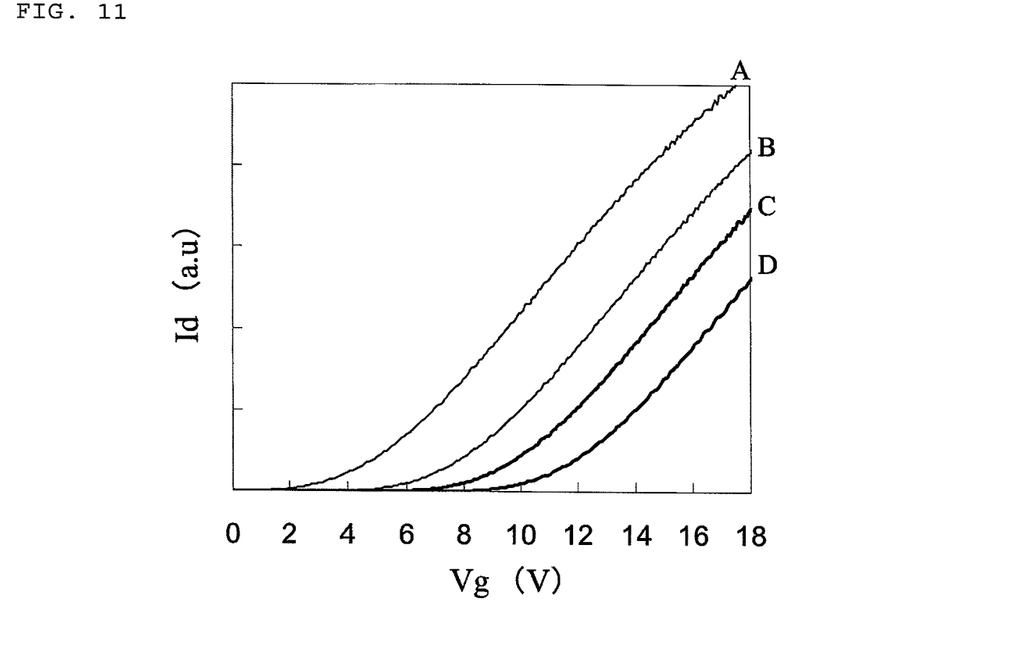
FIG. 11 is a view of the gate voltage (Vg)-drain current (Id) characteristics of a SiC-nDiMOSFET in which an ONO film, which is a laminated film having an electron-trapping characteristic, is used as a gate insulating film.

However, when applying a laminated film having an electron-trapping characteristic to a SiC-DiMOSFET as described in PTL 3, the present inventors and the like daringly produced SiC-nDiMOSFETs in which an ONO film which was a laminated film having an electron-trapping characteristic was used as the gate insulating film, injected electrons, and measured the gate voltage (Vg)-drain current (Id) characteristic in advance as illustrated in FIG. 11. This is because techniques available for Si are not always available for SiC, and there is still a possibility that the gate voltage (Vg)-drain current (Id) characteristic does not shift in parallel due to, for example, the influence of carbon generated by the oxidization of the Si oxide film/SiC or a rough interface or the influence of the deterioration of the insulating film due to a stress electric field, and, conversely, the mobility decreases. Line A in FIG. 11 represents the SiC-nDiMOSFET in an initial state, and Lines B, C and D represent the SiC-nDiMOSFETs in which increasing amounts of electrons are injected, and increasing amounts of electrons are trapped in the laminated films having an electron-trapping characteristic. From the measurement results, it is found that, similar to Si, when electrons are injected as charges, the Vg-Id characteristic shifts rightward in parallel from the initial characteristic in the drawing, and the width of the voltage shift can also be adjusted at a several-volt level.

Based on the above-described results, it could be confirmed that the combination was not meaningful in the Si field, and, the use of the combination of two techniques in the SiC field which barely change the current amount obtained at the driving upper limit of the gate voltage Vg in the Si field can obtain effects that cannot be obtained in the Si field.

As described above, the invention is obtained by providing a gate insulating film having a charge-trapping property to a SiC-DiMOSFET and injecting carriers (electrons) into the gate insulating film. As the gate insulating film, a laminated film obtained by sandwiching a charge retention film in the middle portion with barrier (potential barrier) films from top and bottom is used. When a current is made to flow in the laminated film, electrons are trapped in the interface between the lower barrier film (bottom barrier film) and the charge-trapping film and the interface between the charge-trapping film and the upper barrier film (top barrier film).

The film thickness of the barrier films is extremely important since the film thickness determines the charge-trapping characteristics (retention characteristics).

Unlike Si, SiC has low dielectric breakdown strength of a Si oxide film, and therefore SiC serves as a principal factor that determines the dielectric breakdown strength of an entire MOSFET (limits the dielectric breakdown conditions). Therefore, in the case of the SiC-MOSFET, unlike a Si-MOSFET, it is necessary to seek means for decreasing the dielectric breakdown strength applied to the barrier films.

Therefore, in the case of the SiC-MOSFET, the top barrier film was made to be thicker than the bottom barrier film, thereby improving the reliability of the insulating film and the retention characteristics. This is because, in a case in which gate insulating films having electrically equivalent film thicknesses are made to trap the same number of electrons and are compared, the threshold voltage shift becomes larger as the film thickness of the top barrier film increases. In other words, as the film thickness of the top barrier film increases, it is possible to decrease the number of trapped electrons. Then, it is possible to prevent the damage of the insulating film due to a high electric field when trapping electrons, and therefore it is possible to improve the reliability of the insulating film and the retention characteristics. Furthermore, since it is possible to use a CVD film having lower insulation breakdown field strength than a thermally-oxidized film obtained by directly thermally oxidizing SiC, the degree of freedom in design and process also improves.

Furthermore, when the top barrier film is made to be thick, relatively, a large electric field is applied to the bottom barrier film. Therefore, the use of a Si oxide film obtained by directly thermally oxidizing SiC having high insulation breakdown field strength or a Si oxide film obtained by thermally treating a CVD film for the bottom barrier film becomes preferable in terms of reliability.

Advantageous Effects of Invention

Since it is possible to increase the threshold voltage of an implanted channel-type SiC MOSFET having high channel mobility, it is possible to provide a switching power device having small on-resistance and excellent pressure resistance.

DESCRIPTION OF EMBODIMENTS

In the following embodiments, when required for convenience, the invention will be described in a plurality of divided sections or embodiments; however, unless particularly otherwise described, the sections or the embodiments are mutually related, and one section or embodiment describes the modification example, details and complements of all or part of the other sections or embodiments.

In addition, in the following embodiments, in a case in which the numeric values (including number, value, amount, range and the like) of an element are stated, except for the cases in which the numeric values are particularly specified or are clearly limited to a specific value in principle, the numeric values are not limited to the stated values, and may be equal to or greater or less than the stated values.

Furthermore, in the following embodiments, except for the cases in which components (including component steps and the like) are particularly specified or are clearly considered in principle to be essential, it is needless to say that the components are not necessarily essential.

Similarly, in the following embodiments, when the shapes, positional relationships and the like of the components and the like are stated, the shapes, positional relationships and the like include similar or approximate shapes and the like except for the cases in which the shapes, positional relationships and the like are particularly specified or are clearly considered in principle not to include similar or approximate shapes and the like. This shall apply to the above-described numeric values and ranges as well.

In addition, in all the drawings for describing the embodiments, in principle, similar members will be given similar reference signs, and will not be described again.

Example 1

Here, an example in which a Double-Implanted MOSFET (DiMOSFET) is produced on a (0001) Si surface of a 4H-SiC substrate will be described.

Figure 1:
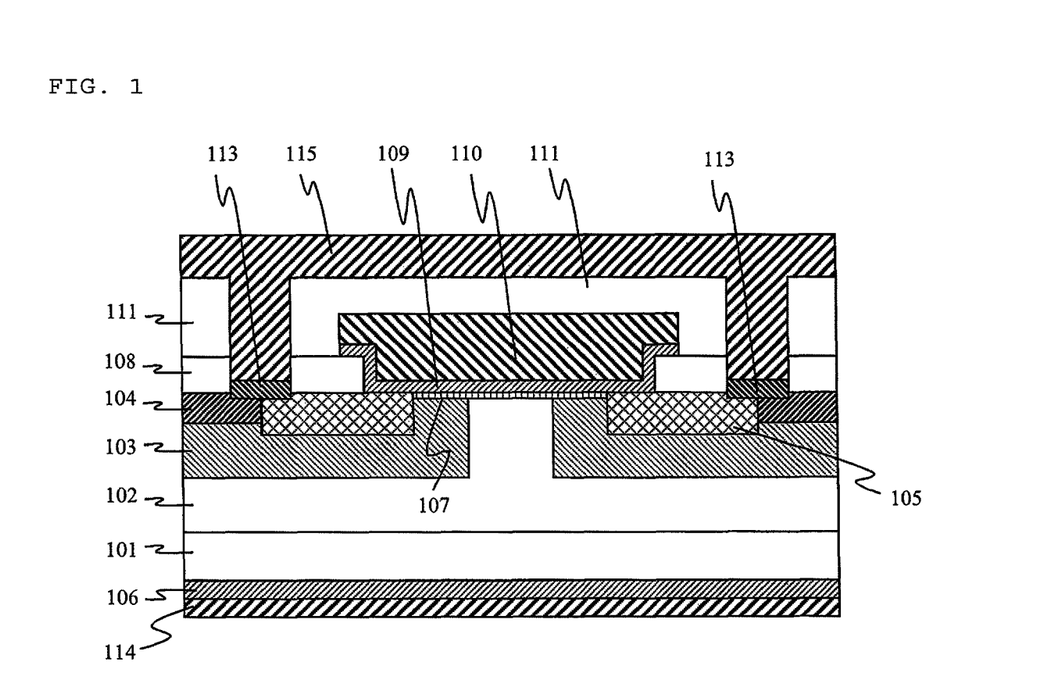
FIG. 1 is a part of a cross-sectional structure of a SiC DiMOSFET of Example 1.

FIG. 1 illustrates the cross-sectional structure of a DiMOSFET produced in Example 1. 101 represents a high-concentration n-type SiC substrate, 102 represents a low-concentration n-type drift layer, 103 represents a p-type body layer, 104 represents a high-concentration p-type diffusion layer, 105 represents a high-concentration n-type diffusion layer, 106 represents a high-concentration n-type layer on a SiC rear surface side, 107 represents an implanted n-type layer, 108 and ill represent insulating films, 109 represents a gate insulating film having charge retention characteristics, 110 represents a gate electrode, 113 represents a silicide layer, 114 represents a rear surface silicide layer (drain electrode), and 115 represents an aluminum wire (source electrode).

A channel in the DiMOSFET is formed in a region sandwiched by the gate electrode 110 and the p-type body layer 103. For example, when the source electrode 115 is used as an earth, a positive voltage is applied to the drain electrode 114, and a positive voltage (that is equal to or greater than the threshold voltage) is applied to the gate electrode 110, a current flows between the source 115 and the drain 114 (in the vertical direction of the SiC substrate). When the gate voltage is set to be equal to or less than the threshold voltage, a current is cut off.

Figure 2:
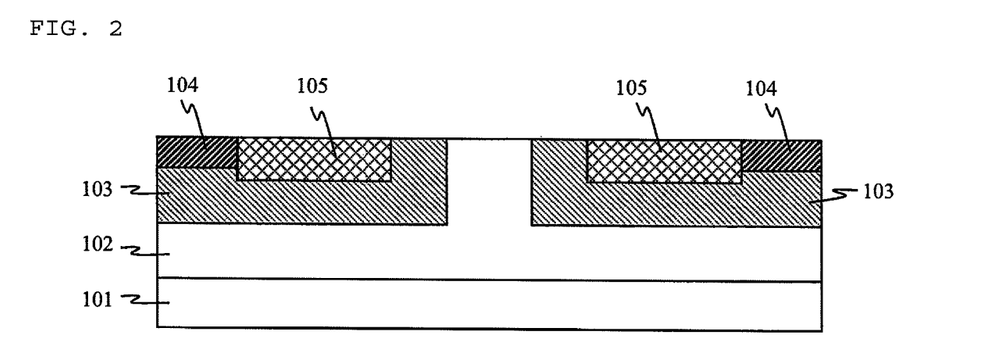
FIG. 2 is a part of the cross-sectional structure of the SiC DiMOSFET of Example 1.

First, the high-concentration n-type SiC substrate 101 on which the low-concentration n-type drift layer 102 was formed approximately 10 um was prepared, and ions were injected into the p-type body 103, the high-concentration p-type diffusion layer 105, and a region which was to serve as the high-concentration n-type diffusion layer using lithography and an ion injection technique. Here, aluminum and nitrogen were respectively used for injection of p-type and n-type impurities. Generally, the pressure resistance of the DiMOSFET is adjusted using the distance a between the right and left p bodies 103 illustrated in FIG. 2 (Junction FET width: JFET width), the depth b of the p body 103 (JFET length), the substrate concentration and thickness of the low-concentration n-type drift layer. In the present example, the JFET width was set in a range of 1 um to 5 um, and the JFET length was set to approximately 1 um.

Subsequently, ions of low-concentration nitrogen were injected into the region 107 in which an inversion channel was to be formed to form an implanted channel. In the present specification, the above-described ion-injected region will be referred to as a counter region 107, and the injection of ions will be referred to as counter injection. In the embodiments, the concentration of nitrogen in the counter region 107 was classified, and a total of four specimens (one specimen on which the counter injection was not carried out and three specimens for which the concentrations of the counter injection were increased little by little) were produced. In one of the four specimens having the highest nitrogen concentration, the concentration was set to a concentration slightly higher than the aluminum surface concentration of the p-type body 103.

Figure 3:
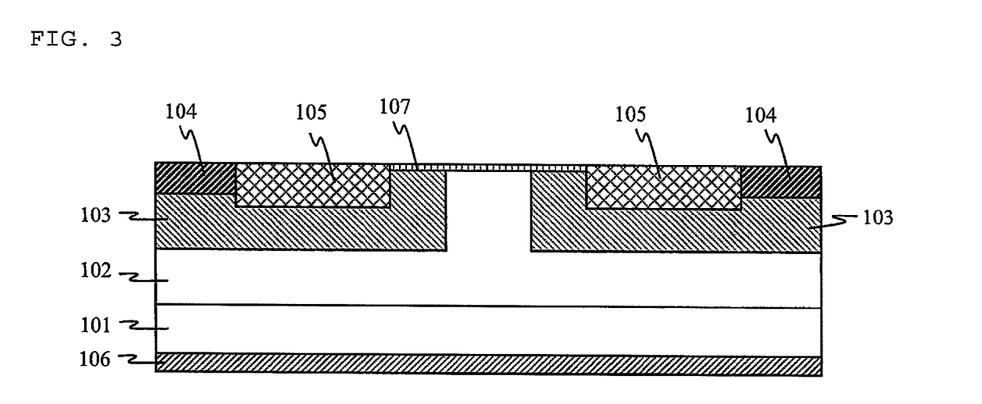
FIG. 3 is a part of the cross-sectional structure of the SiC DiMOSFET of Example 1.

Next, ion injection was carried out on a region which was to serve as the high-concentration n-type layer on the rear surface. Next, 50 nm-thick carbon films (not denoted) were formed on the front surface and rear surface of the SiC substrate using a plasma CVD method, and activation annealing was carried out at 1800° C. for 2 minutes. Subsequently, the carbon films were removed through plasma etching, and then the substrate and the layers were washed, whereby the cleaning of the SiC substrate was carried out (FIG. 3).

Figure 4:
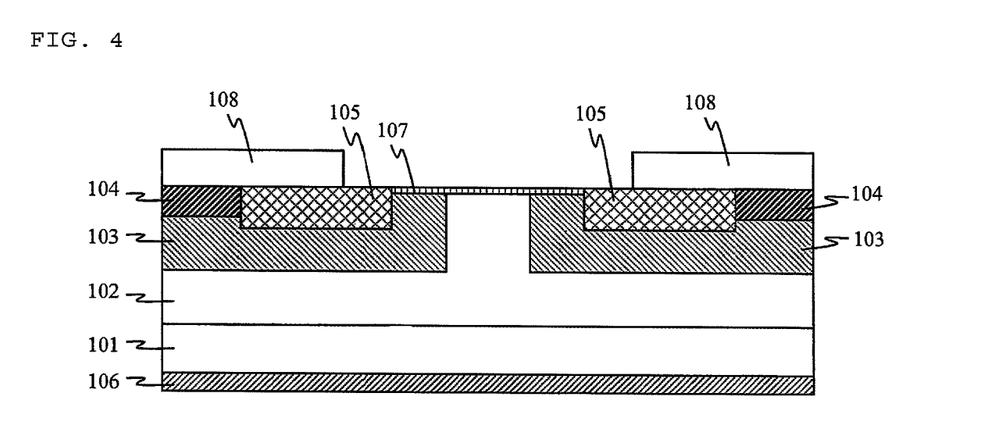
FIG. 4 is a part of the cross-sectional structure of the SiC DiMOSFET of Example 1.

Next, an approximately 500 nm-thick Si oxide film 108 was formed on the front surface side of the SiC substrate using a CVD method, then, a region on which the gate insulating film 109 was to be formed was opened, and the front surface of the SiC substrate was locally exposed (FIG. 4).

Figure 5:
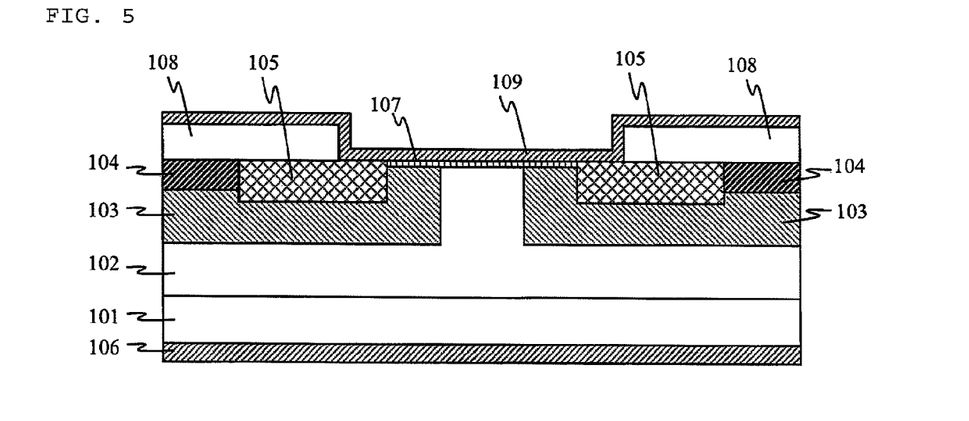
FIG. 5 is a part of the cross-sectional structure of the SiC DiMOSFET of Example 1.
Figure 6:
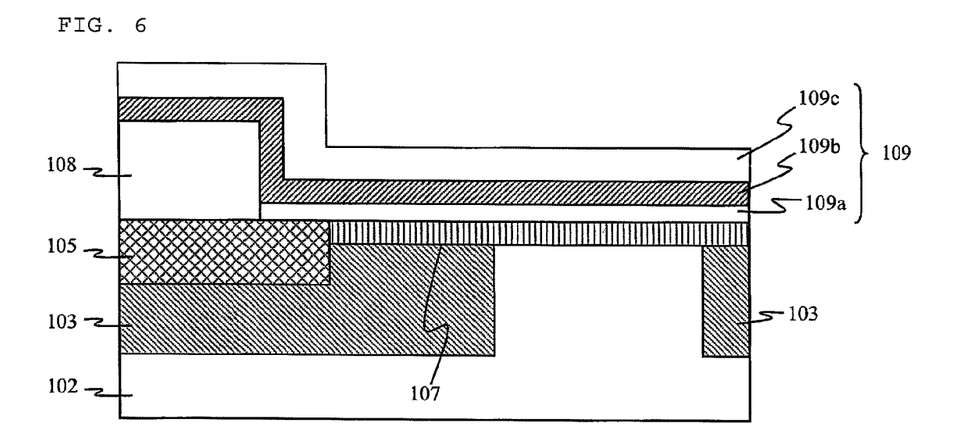
FIG. 6 is a part of the cross-sectional structure of the SiC DiMOSFET of Example 1.

Next, the laminated gate insulating film 109 having a charge-trapping characteristic was formed (FIG. 5). The gate insulating film 109 formed in the example is formed of three film layers as illustrated in FIG. 6. First, in the beginning, the SiC substrate was thermally treated at 1300° C. in a NO gas atmosphere, and a 10 nm-thick Si oxynitride film 109a was formed. Next, a 10 nm-thick alumina film 109b was formed using an atomic layer deposition (ALD method) in which trimethylaluminum (TMA) and ozone ($O_3$) were used as raw material gas. Subsequently, a 35 nm-thick Si oxide film 109c was formed using a CVD method in which dichlorosilane ($SiH_2Cl_2$) and nitrous oxide ($N_2O$) were used as raw material gas, and then wet-oxidization was carried out at 850° C. for 10 minutes, thereby reforming the Si oxide film 109c. Here, the Si oxynitride film 109a on the bottom layer is the bottom barrier film 109a, the Si oxide film 109c on the top layer is the top barrier film 109c, and the aluminum film 109b in the middle layer is the charge retention film 109b (FIGS. 5 and 6). Meanwhile, in the example, specimens in which the film thickness of the bottom barrier film was 5 nm and the film thickness of the top barrier film was 40 nm were also produced. The electrical film thickness of the above-described three-layer laminated film in terms of the Si oxide film was approximately 50 nm.

In the example, while the bottom barrier film is described as the Si oxynitride film 109a, strictly speaking, the concentration of nitrogen in the bulk region is extremely small, and most of nitrogen is present at the SiC interface. Nitrogen present at the SiC interface decreases the interface state density at the interface in the 4H-SiC substrate. In the studies, in a case in which a thermal treatment was carried out at 1300° C. in a high-concentration NO atmosphere (approximately 900), the concentration of nitrogen at the interface in the SiC substrate was approximately 1%. As a result of comparing the interface state densities between when NO annealing was carried out and when NO annealing was not carried out, when NO annealing was carried out, the interface state in the vicinity of the conduction band of silicon carbide decreased by one order of magnitude.

Figure 7:
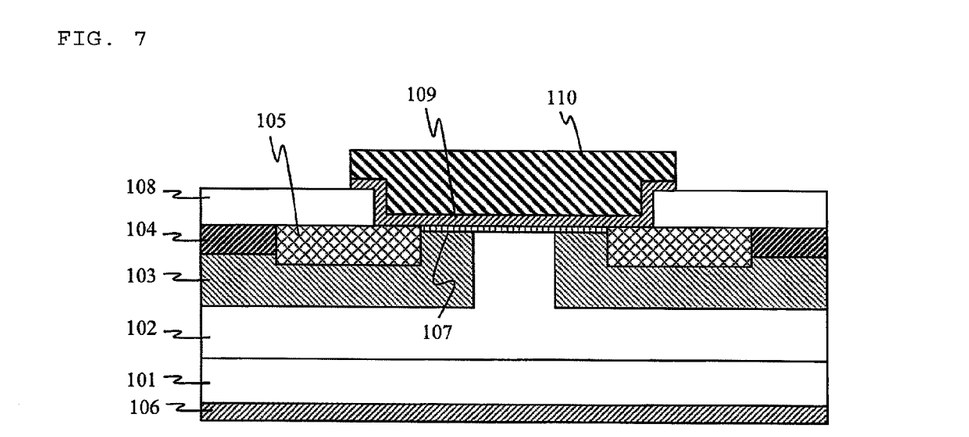
FIG. 7 is a part of the cross-sectional structure of the SiC DiMOSFET of Example 1.

Next, after a 500 nm-thick phosphorous-doped amorphous Si film was formed using a CVD method in which disilane ($Si_2H_6$) and phosphine ($PH_3$) were used as raw material gas, a phosphorous (P)-doped polycrystalline Si film was produced using a high-temperature thermal treatment. After that, the phosphorous-doped polycrystalline Si film was processed using lithography and a dry etching technique so as to produce the gate electrode 110. In the example, some of the gate insulating film 109 below the gate electrode 110 was removed using dry etching. Consideration is given so that edges of the gate electrode 110 in the DiMOSFET formed in the example are processed on the thick Si oxide film 108 as illustrated in FIG. 7 so as to prevent the reliability of the gate insulating film 109 from deteriorating.

Figure 8:
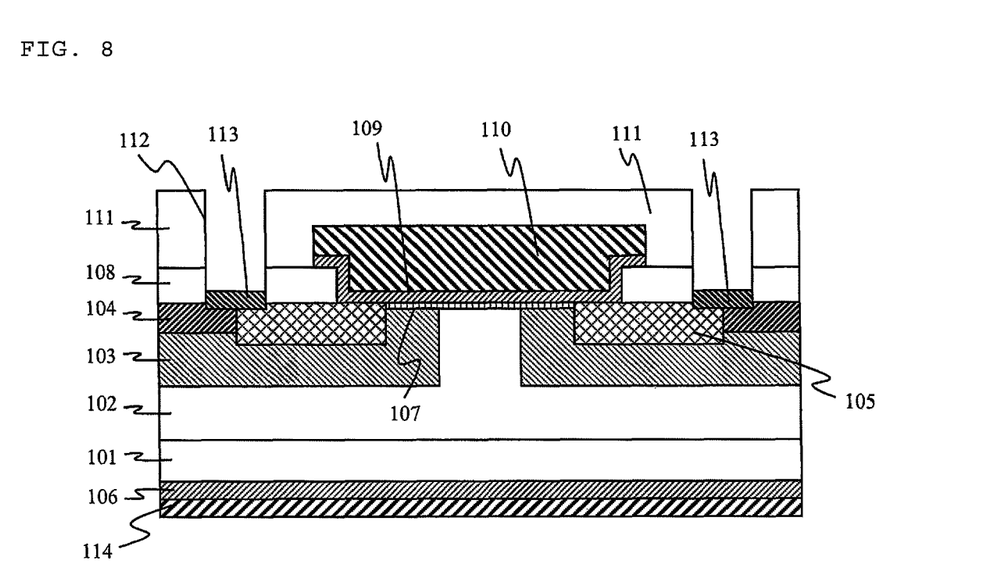
FIG. 8 is a part of the cross-sectional structure of the SiC DiMOSFET of Example 1.

Next, after the insulating film 111 was formed using the CVD method, an opening portion 112 through which the SiC-based high-concentration p-type diffusion layer 104 and the high-concentration n-type diffusion layer 105 are exposed at the same time was formed. After that, nickel silicide 113 and 114 were formed on the front surface of the diffusion layer on the bottom of the opening portion 112 and the rear surface of the SiC substrate (FIG. 8). In FIG. 8, while not illustrated in the drawing, an opening portion through which the front surface of the gate electrode 110 was exposed was formed afterwards. Finally, dry washing was carried out on the front surface of the nickel silicide, a Ti/TiN/AL laminated film was deposited, and then the above-described laminated wires were processed into a predetermined shape, thereby forming a source wire 115 and a gate electrode pad (FIG. 1).

To trap electrons, after forming the device structure of the SiC-MOSFET, a current is made to flow from the gate electrode side or the SiC substrate side toward the gate insulating film, and some electrons are trapped. The degree of the threshold voltage shifted by electrons trapped in the gate insulating film is set using a voltage applied from outside and the time.

Figure 9:
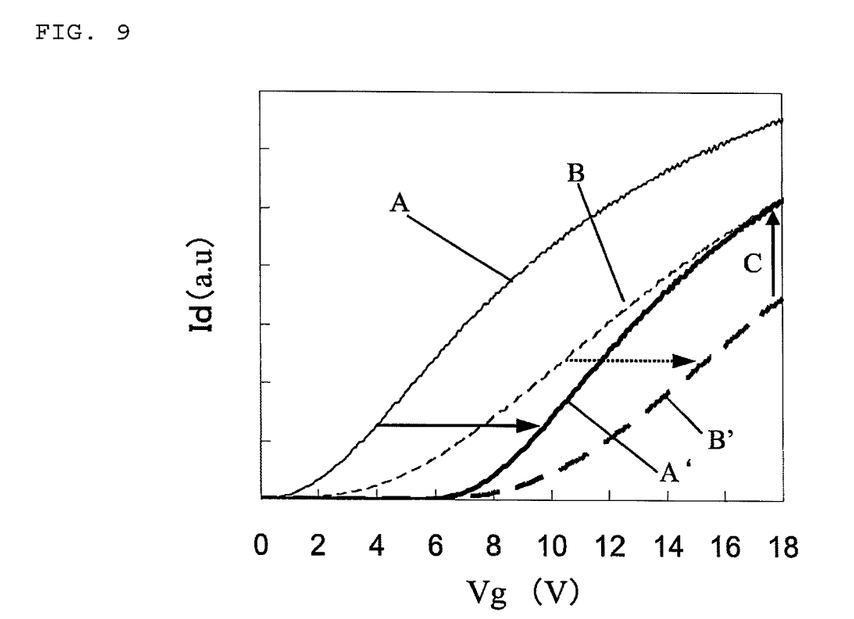
FIG. 9 is a view of gate voltage (Vg)-drain current (Id) characteristics.

FIG. 9 is a view illustrating the comparison of the Vg-Id characteristics between specimens in which the implanted channel was formed (counter N injection) and specimens in which the implanted channel was not formed. Solid lines A and A' in the drawing represent the initial characteristics of the specimens before injecting electrons into the gate insulating film. Broken lines B and B' represent the characteristics of the specimens after injecting electrons into the gate insulating film. Electrons were injected into the laminated gate insulating films by fixing the source electrode 115 and the drain electrode 114 to 0 V, and applying 38 V of a direct voltage (DC) of a pulse to the gate electrode 110. The pulse width was set to 100 nanoseconds, and the threshold voltage was adjusted so as to become almost identical. As is evident from the drawing, when comparison was conducted using the specimens in which electrons were injected to the gate insulating film, a large current could be ensured in the specimens in which the implanted channel was formed. That is, it was possible to satisfy both high threshold voltage and high channel mobility. In the example, while the initial threshold voltage before the injection of electrons was set to approximately 1 V, needless to say, it is also possible to fully deplete the threshold voltage (a drain current is made to flow at the gate voltage of 0 V) so as to further increase the channel mobility. In this case, it is possible to adjust the threshold voltage by increasing the number of electrons trapped in the gate insulating film after the completion of the device.

As described above, the example applies a combination of the implanted channel and a technique to inject carriers (electrons) into the gate insulating film having an electron-trapping property to the SiC nMOSFET.

In addition, the gate insulating film preferably includes a laminated film in which Si oxide films or Si oxynitride films are made to sandwich a charge retention film in the middle portion from top and bottom, and serve as barrier (potential barrier) films. When a current is made to flow in the laminated film, electrons are trapped in the interface between the lower barrier film (bottom barrier film) and the charge-trapping film and in the interface between the charge-trapping film and the upper barrier film (top barrier film), and the threshold voltage Vth shifts in parallel.

The film thickness of the barrier films is an extremely important parameter since the film thickness determines the charge-trapping characteristics (retention characteristics).

Unlike Si, SiC has lower dielectric breakdown strength than Si oxide films, and therefore SiC serves as a principal factor that determines the dielectric breakdown strength of the entire MOSFET (limits the dielectric breakdown conditions). Therefore, in the case of the SiC-MOSFET, unlike a Si-MOSFET, it is necessary to seek means for decreasing the dielectric breakdown strength applied to the barrier films.

Therefore, in the case of the SiC-MOSFET, the top barrier film was made to be thicker than the bottom barrier film, thereby improving the reliability of the insulating film and the retention characteristics. This is because, in a case in which gate insulating films having electrically equivalent film thicknesses are made to trap the same number of electrons and are compared, the threshold voltage Vth shift becomes larger as the film thickness of the top barrier film increases. In other words, as the film thickness of the top barrier film increases, it is possible to decrease the number of trapped electrons. Then, it is possible to prevent the damage of the insulating film due to a high electric field when trapping electrons, and therefore it is possible to improve the reliability of the insulating film and the retention characteristics. Furthermore, since it is possible to use a CVD film having lower insulation breakdown field strength than a thermally-oxidized film obtained by directly thermally oxidizing SiC, the degree of freedom in design and process also improves.

Furthermore, when the top barrier film is made to be thick, relatively, a large electric field is applied to the bottom barrier film. Therefore, the use of a Si oxide film obtained by directly thermally oxidizing SiC having high insulation breakdown field strength or a Si oxide film obtained by thermally treating a CVD film for the bottom barrier film becomes preferable in terms of reliability.

Furthermore, to obtain favorable retention characteristics so as to satisfy both high pressure resistance and high mobility and to hold both high pressure resistance and high mobility, the film thickness of each barrier film is also extremely important since the film thickness determines the charge-trapping characteristics (retention characteristics).

Here, the important factors are a high temperature and the prevention of a change in the threshold voltage in a bias application state.

Figure 12:
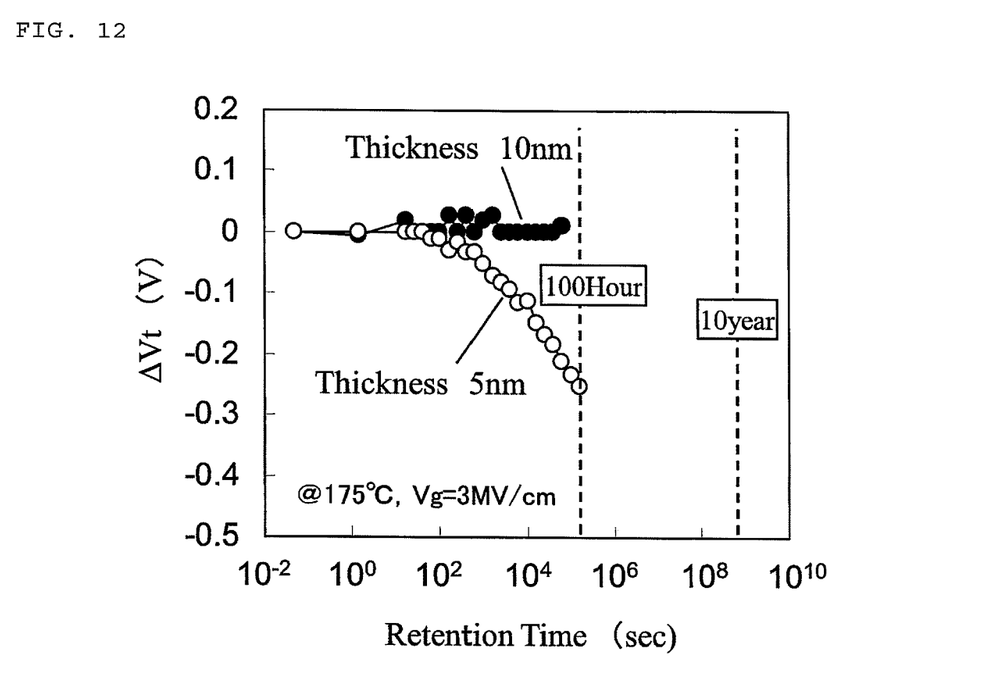
FIG. 12 is a view of two retention characteristics in a case in which the bottom barrier film thicknesses of an n-DiMOSFET are set to 5 nm and 10 nm.

When the bottom barrier film in contact with SiC has a predetermined film thickness, the retention characteristics improve. FIG. 12 illustrates two retention characteristics in a case in which the bottom barrier film thicknesses of the n-DiMOSFET are set to 5 nm and 10 nm. The characteristics are the results obtained when an ONO film is used as the structure of the gate insulating film, in a case in which the film thickness of the bottom barrier film is 5 nm, the thickness of the top barrier film is set to 40 nm and the thickness of the charge-trapping film is set to 5 nm, in a case in which the film thickness of the bottom barrier film is 10 nm, the thickness of the top barrier film is set to 35 nm and the thickness of the charge-trapping film is set to 5 nm, and a stress electric field (an electric field applied to the gate insulating film during the operation of the SiC DiMOSFET) of 3 MV/cm is applied to the gate insulating film in an operation environment of 175° C. It is found from the reference of 100 hour-long actual measured values that there is a lack of practicality when the thickness of the bottom barrier film is 5 nm. As a result of separate simulation of 10 year-long reliability, the threshold voltage Vth decreases by 0.5 [V] or more when the thickness of the bottom barrier film is 5 nm. When the thickness of the bottom barrier film is 10 nm, a decrease in the threshold voltage Vth is not observed from 100 hour-long actual measured values, and favorable retention characteristics are still maintained after 10 years. Therefore, to obtain favorable retention characteristics so as to satisfy both high pressure resistance and high mobility and to hold both high pressure resistance and high mobility, the thickness of the bottom barrier film is preferably 10 nm or more.

As a result of carrying out the same studies on the top barrier film, results of the thickness of the top barrier film needing to be approximately 10 nm were obtained ($\Delta Vt<0.5$ V after 10 years).

In addition, there is a preferable film thickness with the charge-trapping film. When the thickness of the charge-trapping film is set to 5 nm or more, it is possible to improve the retention characteristics.

Therefore, to obtain favorable retention characteristics, when the thickness of the gate insulating film is 25 nm or more, the thickness of the barrier films that sandwich the charge-trapping film is 10 nm or more, and the top barrier film is made to be thicker than the bottom barrier film, it is possible to obtain favorable retention characteristics.

In addition, the material of the laminated film is also extremely important since the material determines the charge-trapping characteristics (retention characteristics).

When a current is made to flow in the laminated film, electrons are trapped in the interface between the bottom barrier film and the charge-trapping film and in the interface between the charge-trapping film and the top barrier film. The barrier films are preferably Si oxide films or Si oxynitride films, and the charge-trapping film is preferably a Si nitride film or an alumina film (High-k film) since the electron trapping level is present at 1 eV or more deeper than the conduction band, and extremely stable trapping characteristics are exhibited. Particularly, an alumina film serving as the charge-trapping film is preferable since the alumina film has more favorable retention characteristics than Si nitride film. The Si nitride film includes positive fixed charges, and the alumina film includes negative fixed charges. When the initial threshold voltages before trapping electrons are compared, the alumina film having negative fixed charges exhibits a large value. Therefore, the use of the alumina film can decrease the number of electrons being trapped.

As the barrier film, particularly, as the bottom barrier film, it is preferable to use a Si oxide film in which the composition ratio of Si:O can be approximated to 1:2, a Si oxynitride film formed through a oxynitriding treatment in a high-temperature NO atmosphere, a Si oxynitride film formed by oxynitriding a Si oxide film formed using a chemical vapor deposition method (CVD method) in a high-temperature NO atmosphere, or a Si oxynitride film formed by directly oxynitriding a SiC substrate in a high-temperature NO atmosphere, such as a Si oxide film formed by thermally oxidizing a SiC substrate and a thermally-oxidized CVD-Si oxide film (P-CVD film, thermal CVD film or photo CVD film). Then, the interface state at the interface in the SiC substrate is decreased due to a NO oxynitriding treatment so that the mobility improves, and it is possible to obtain favorable reliability of the insulating film or favorable retention characteristics as described above. Meanwhile, when a Si oxide film that is significantly decomposed into a composition ratio of Si:O of 1:2, such as a Si oxide film produced using P-CVD that does not undergo a high-temperature step (that is not thermally oxidized) is used, the mobility is extremely low, the retention characteristics cannot be held at a high gate voltage Vg, which is for high-voltage use (600 m or more), and there is a possibility of some of the trapped electrons being discharged.

Furthermore, there is a plurality of methods for forming the implanted n-type layer right below the gate insulating film, and the most convenient method is the counter injection of nitrogen using an ion injection method or an n-type SiC homoepitaxial method, but the impurity concentration or depth (thickness) of nitrogen is preferably a concentration that is slightly larger than or almost the same as the concentration of aluminum in the vicinity of the front surface of the p-type body region, and the depth (thickness) is preferably in a range of approximately 30 nm to 150 nm. In studies by the inventors and the like, when the depth (thickness from the interface) of the implanted n-type layer is set to approximately 30 nm or more, it becomes possible to significantly suppress the influence of the interface state at the interface in the SiC substrate. In contrast, when the depth (thickness from the interface) of the implanted n-type layer becomes deep, since the influence of the gate electric field decreases, naturally, the threshold voltage Vth and the gate voltage Vg also need to be increased by that amount; however, when the depth is approximately 150 nm or less, the channel control using the gate electric field is possible.

Furthermore, in a case in which electrons were trapped in the gate insulating film, as the substrate temperature increased, it was possible to suppress the change amount of the threshold voltage. This is because, in a case in which electrons are injected at a high temperature, electrons trapped at a shallow trap level are likely to be de-trapped, and therefore electrons are trapped at a relatively deep trap level during the injection of electrons. In the study results, in a case in which electrons are injected at a temperature of 100° C. or higher, almost the same retention characteristics were exhibited. Therefore, the substrate temperature when electrons are trapped in the gate insulating film is effectively 100° C. or higher.

In the example, the injection of nitrogen ions was used to form the implanted channel layer, but the same effects could be obtained as well when a low-concentration n-type SiC layer was formed using a SiC homoepitaxial method.

In the example, a step of carrying out electron injection on the gate insulating film was carried out at a wafer level after the completion of the device, but it is needless to say that the step can be carried out after chip dicing or after package assembly.

In addition, in the example, electrons were injected from the SiC substrate side, but it is also possible to inject electrons from the gate electrode side by applying the gate electrode to a negative bias.

The present example describes an example of the SiC DiMOSFET, but the invention can also be applied to trench MOSFETs as long as the trench MOSFETs are SiC MOSFETs having an implanted channel.

REFERENCE SIGNS LIST

- 101 high-concentration n-type SiC substrate
- 102 low-concentration n-type drift layer
- 103 p-type body layer
- 104 high-concentration p-type diffusion layer
- 105 high-concentration n-type diffusion layer
- 106 rear surface high-concentration n-type layer
- 107 implanted n-type layer
- 108, 111 insulating film
- 109 gate insulating film having charge retention characteristic
- 110 gate electrode
- 112 opening portion of insulating film (source connection portion)
- 113 silicide layer
- 114 drain electrode (silicide layer)
- 115 source electrode

The invention claimed is:

1. A field effect silicon carbide transistor comprising:
    a silicon carbide layer;
    a gate insulating film formed on a first surface of the silicon carbide layer;
    a gate electrode formed on the gate insulting film;
    a source electrode formed on the silicon carbide layer; and
    a drain electrode formed on a second surface that is a rear surface of the first surface of the silicon carbide layer,
    wherein the silicon carbide layer has a channel-implanted structure in which a first region that is identically charged to a drain region and a second region that is oppositely charged to the first region are sequentially disposed from a gate insulating film side right below the gate insulating film,
    the gate insulating film includes a charge storage layer, a bottom barrier film present between the silicon carbide layer and the charge storage layer, and a top barrier film present between the gate electrode and the charge storage layer, and
    charges are stored in the charge storage layer.

2. The field effect silicon carbide transistor according to claim 1,
    wherein a channel is present in an in-plane direction.

3. The field effect silicon carbide transistor according to claim 1,
    wherein the top barrier film is thicker than the bottom barrier film.

4. The field effect silicon carbide transistor according to claim 3,
    wherein the bottom barrier layer has a film thickness of 10 nm or more.

5. The field effect silicon carbide transistor according to claim 3,
    wherein the bottom barrier layer is made of a Si oxide film or a Si oxynitride film.

6. The field effect silicon carbide transistor according to claim 5,
    wherein the Si oxide film is a film obtained by heating $SiO_2$ formed using CVD.

7. The MOS-type field effect transistor according to claim 5,
    wherein approximately 1% of nitrogen is present in an interface between the bottom barrier layer and the silicon carbide layer.

8. The field effect silicon carbide transistor according to claim 3,
    wherein the top barrier layer has a film thickness of 10 nm or more.

9. The field effect silicon carbide transistor according to claim 3,
    wherein the top barrier layer is made of a Si oxide film or a Si oxynitride film.

10. The field effect silicon carbide transistor according to claim 3,
    wherein the charge storage layer has a film thickness of 5 m or more.

11. The field effect silicon carbide transistor according to claim 3,
    wherein the charge storage layer is made of an aluminum oxide film or a Si oxynitride film.

12. The field effect silicon carbide transistor according to claim 3,
    wherein a thickness of the first region is in a range of 30 nm to 150 nm.

* * * * *